(12) United States Patent
Spencer et al.

(10) Patent No.: US 9,057,751 B2
(45) Date of Patent: Jun. 16, 2015

(54) GROUND FAULT DETECTION FOR AN ELECTRICAL SUBSEA CONTROL SYSTEM

(75) Inventors: Ronald Spencer, Houston, TX (US); Kirtikumar Patel, Fresno, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 985 days.

(21) Appl. No.: 13/094,178

(22) Filed: Apr. 26, 2011

(65) Prior Publication Data

US 2011/0267070 A1    Nov. 3, 2011

Related U.S. Application Data

(60) Provisional application No. 61/329,960, filed on Apr. 30, 2010.

(51) Int. Cl.
  *G01R 31/14* (2006.01)
  *G01R 31/02* (2006.01)

(52) U.S. Cl.
  CPC .................................... *G01R 31/025* (2013.01)

(58) Field of Classification Search
  USPC .................. 324/508–512, 500, 522, 525, 528
  See application file for complete search history.

(56) References Cited

U.S. PATENT DOCUMENTS

| 6,040,969 | A  | * | 3/2000  | Winch et al. ..................... 361/82 |
| 6,961,226 | B2 | * | 11/2005 | Mason et al. .................... 361/42 |
| 8,054,593 | B2 | * | 11/2011 | Reid et al. ....................... 361/42 |

FOREIGN PATENT DOCUMENTS

| DE | 10257330 A1 | 6/2004 |
| JP | 58066874 A  | 4/1983 |
| JP | 07007849 A  | 1/1995 |

* cited by examiner

*Primary Examiner* — Melissa Koval
*Assistant Examiner* — Trung Nguyen
(74) *Attorney, Agent, or Firm* — Patrick Traister; Brandon Clark; Jeffery R. Peterson

(57) ABSTRACT

A ground fault detection circuit for detecting ground faults in electrical subsea conductor lines including a first electrical conductor line, a second electrical conductor line, a first ground fault detection line, and a second ground fault detection line. The ground fault detection circuit further includes a first resistor operatively connected to a voltage source and the first ground fault detection line, a second resistor operatively connected to the voltage source and the second ground fault detection line, and a voltage detection device configured to detect the voltage at an output end of the first resistor to determine the presence of a ground fault in at least one of the first and second conductor lines.

15 Claims, 3 Drawing Sheets

GROUND FAULT DETECTION FOR AN ELECTRICAL SUBSEA CONTROL SYSTEM

CROSS-REFERENCE TO RELATED APPLICATIONS

This Application claims the benefit of U.S. Provisional Application 61/329,960 filed on Apr. 30, 2010.

BACKGROUND OF INVENTION

A variety of subsea control systems are employed for use in controlling subsea wells during, for example, emergency shutdowns. In many applications, the subsea systems may comprise a number of electrical lines that may be used to control a number of valves. During a specific valve operation, an operations engineer may issue a command via a human machine interface from a topside master controller station. The umbilical may be operationally connected to surface sources of power (e.g., electrical and hydraulic) in addition to electronics, communications, and power that may be provided via the topside master control station. For example, control signals may be sent down the umbilical to operate a number of solenoid valves and a subsea control module to actuate a number of directional control valves.

The umbilical spans the distance necessary to reach the various components of the subsea control systems, which may be located thousands of meters below the sea surface. Thus, the subsea electrical lines and components are difficult to reach while deployed subsea. Accordingly, there remains a need to easily diagnose the integrity of the subsea portions of the umbilical and other electrical lines used to control the various subsea components from the topside master controlled station to ensure the proper operation of, for example, the safety control features of the subsea control system.

SUMMARY OF INVENTION

In general, in one aspect, the invention relates to a ground fault detection circuit for detecting ground faults in electrical subsea conductor lines, including a first electrical conductor line, a second electrical conductor line, a first ground fault detection line, a second ground fault detection line, a voltage source, a first resistor operatively connected to the voltage source and the first ground fault detection line, a second resistor operatively connected to the voltage source and the second ground fault detection line, and a voltage detection device configured to detect the voltage at an output end of the first resistor to determine the presence of a ground fault in at least one of the first and second conductor lines.

In general, in one aspect, the invention relates to a ground fault detection system for detecting ground faults in electrical subsea conductor lines including a power supply unit, a ground fault detection circuit, a line enable switching module, and a voltage detection device. One or more embodiments of the ground fault detection system may include a power supply unit that is configured to supply power to the ground fault detection circuit and a subsea load.

In general, in one aspect, the invention relates to a method for detecting ground faults in electrical subsea conductor lines using a ground fault detection system, the method including operatively connecting a first resistor between a voltage source and a first ground fault detection line in a ground fault detection circuit, operatively connecting a second resistor between the voltage source and a second ground fault detection line the ground fault detection circuit, and detecting a voltage at an output end of the first resistor to determine the presence of a ground fault in at least one of the first and second conductor lines.

Other aspects and advantages of the invention will be apparent from the following description and the appended claims.

DETAILED DESCRIPTION

Figure 1:
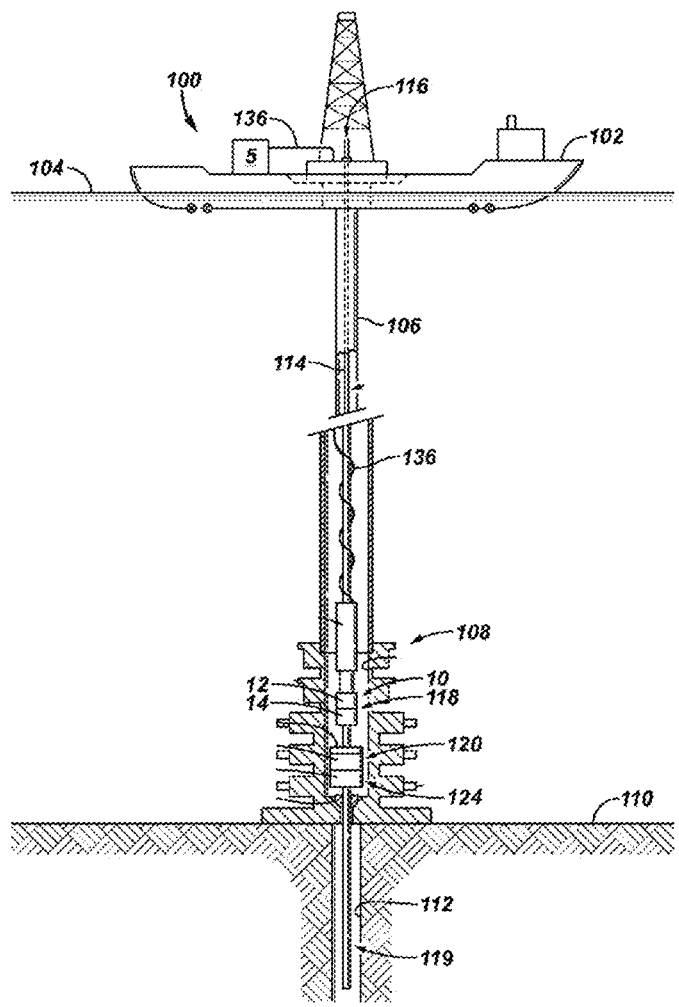
FIG. 1 illustrates a subsea production well testing system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to an apparatus and method for detecting ground faults in a subsea control system. More specifically, embodiments of the invention provide an apparatus and method for detecting electrical line shorts to earth ground for electrical lines used to power various subsea well components, for example, test trees and their control systems, tubing hanger running tools, and subsea valves. In accordance with one or more embodiments of the invention, a ground fault detection apparatus may continuously monitor electrical subsea conductor lines for leakage to earth ground so as to provide an indication of a shorted electrical line. Under a ground fault condition, the attempted operation of a shorted electrical line may lead to tool failure and/or damage to sensitive electronics, e.g., the power supply units.

FIG. 1 illustrates a subsea production well testing system 100 which may be employed to test production characteristics of a well, in accordance with one or more embodiments of the invention. Subsea production well testing system 100 includes a vessel 102 which is positioned on a water surface 104 and a riser 106 which connects vessel 102 to a blowout preventer ("BOP") stack 108 on seafloor 110. A well 112 is drilled into seafloor 110, and a tubing string 114 extends from vessel 102 through BOP stack 108 into well 112. Tubing string 114 is provided with a bore 116 through which hydrocarbons or other formation fluids can be conducted from well 112 to the surface during production testing of the well.

Well testing system 100 includes a safety shut-in system 118 which provides automatic shut-in of well 112 when conditions on vessel 102 or in well 112 deviate from preset limits. Safety shut-in system 118 includes a subsea tree 120 (e.g., subsea test tree, "SSTT"), a subsea tree control system 10, a topside master control station 5 and various subsea safety valves ("SV") such as valve assembly 124, and one or more blowout preventer stack rams.

Umbilical 136 includes conductor lines connecting a topside master control station 5 to subsea tree control system 10. Furthermore, umbilical 136 is often required to extend to great length, for example 12,500 feet (3,810 m) or more. Umbilical 136 includes one or more conductor lines for transmitting signals from the surface to the subsea control system.

In the illustrated embodiment, subsea tree control system 10 is a modular unit that includes a subsea electronics module ("SEM") 12 and a hydraulic valve and manifold pod 14. Subsea tree control system 10 may include other elements such as hydraulic accumulators, electric power sources and the like. Subsea control system 10 is positioned below water surface 104 and proximate to tree 120 in this embodiment. Umbilical 136 may be operationally connected to surface sources of power (e.g., electrical, hydraulic) in addition to electronics, communications, and power that may be provided via topside master control station 5. Subsea tree control safety system 10 may be positioned in various positions within riser 106.

Ground faults may occur in subsea systems when, for example, any part of an electrical power line operatively connected to a subsea component makes electrical contact (or "shorts") to any conductive part of the subsea production well testing system, for example, a subsea test tree. As described herein, a "ground fault" is a low impedance electrical path, or connection, to earth ground in one or more places along the electrical power line.

Figure 2A:
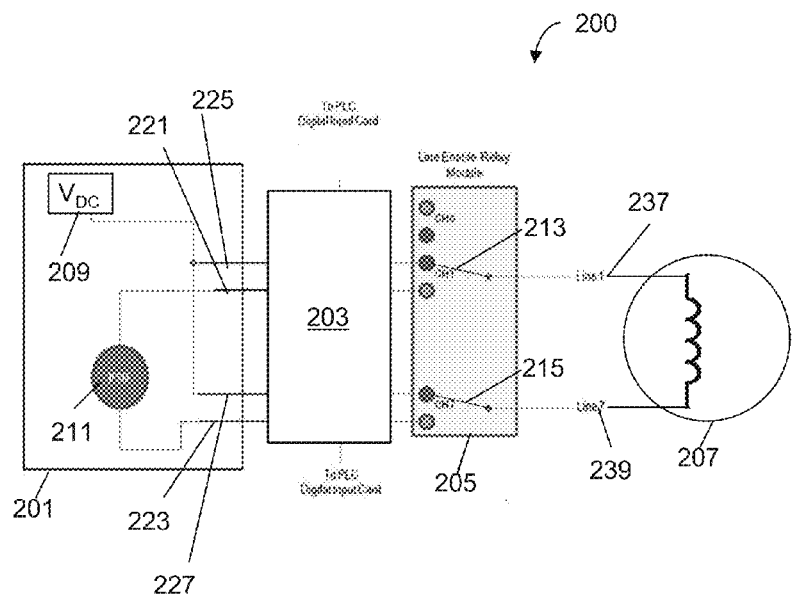
FIG. 2A is a block diagram of a ground fault detection system in accordance with one or more embodiments of the invention.

FIG. 2A is a block diagram of a ground fault detection system in accordance with one or more embodiments of the invention. According to this embodiment, the ground fault detection system 200 includes power supply unit 201, ground fault detection circuit 203, line enable relay module 205, and load 207. One of ordinary skill will appreciate that many different types of loads may be driven with the ground fault detection system 200. For illustrative purposes only, load 207 is shown as a solenoid valve in FIG. 2A. In accordance with one or more embodiments, power supply unit 201 may be provided, for example, within a vessel as part of topside master control station as shown in FIG. 1. Furthermore, fault detection circuit 203 and line enable relay module 205, may both be provided as part of a subsea tree control safety system, or the like. The particular configuration of the individual components comprising the ground fault detection system 200 are shown as illustrative examples, only. Accordingly, one of ordinary skill will appreciate that any or all of the power supply units 209 and 201, the fault detection circuit 203, or the line enable relay module 205 may alternatively be located at any convenient subsea (e.g., at any location within the riser) or topside location without departing from the scope of the present invention.

Power supply unit 201 may include fault detection circuit power supply 209 and load power supply unit 211. In accordance with one or more embodiments, load power supply unit 211 may be configured as a current source. Accordingly, load power supply unit 211 includes current source line 221 and current return line 223. Furthermore, in accordance with one or more embodiments of the invention, fault detection circuit power supply 209 may be configured as a regulated DC power supply that includes ground fault detector lines 225 and 227. In accordance with one or more embodiments, lines 221, 223, 225, and 227 may be incorporated along with all the other necessary control, power, hydraulic, etc., lines into the umbilical 136. One of ordinary skill will appreciate that the block diagram of power supply unit 201, shown in FIG. 2A, is greatly simplified. Accordingly, many other known elements may be included within power supply unit 201, depending on, for example, the particular type and number of subsea loads being driven, e.g., flapper valves, ball valves, solenoid valves, retainer valves, pipe ram seals, shear ram seals, etc. For example, in certain embodiments, dual polarity power may be required to operate the load, in which case, a polarity relay module may be included. Furthermore, various additional control electronics, such as multiplexors and demultiplexors may be implemented to allow for multiple load control and multiple line ground fault detection.

Line enable relay module 205 is configured to allow for switching between two configurations, a fault detect configuration and normal configuration (not shown). Under fault detect configuration, electrical subsea conductor lines 237 and 239 may be connected to ground fault detection lines 225 and 227, respectively. Alternatively, under normal configuration, electrical subsea conductor lines 237 and 239 may be connected to current source line 221 and current return line 223, respectively. In accordance with one or more embodiments of the invention, the line enable relay module 205 may be configured to default to the fault detect configuration, i.e., fault detect power lines 225 and 227 are wired to the normally closed terminals of their respective relays on the line enable relay module 205. In accordance with one or more embodiments, the ground fault detection system may be configured to detect ground faults when in an idle state (i.e., when no subsea loads are being powered). One of ordinary skill will appreciate that the electrical subsea conductor lines 237 and 239 may be switched in a variety of ways using any switching device known in the art, e.g., by using solid state switches, mechanical relays, multiplex/demultiplexors, etc.

While FIG. 2A shows the ground fault detection system in the context of control lines for a solenoid valve, one of ordinary skill will appreciate that without departing from the scope of the present disclosure, the ground fault detection system may be used to detect ground faults in any electrical line, regardless of the specific type of equipment being employed.

Figure 2B:
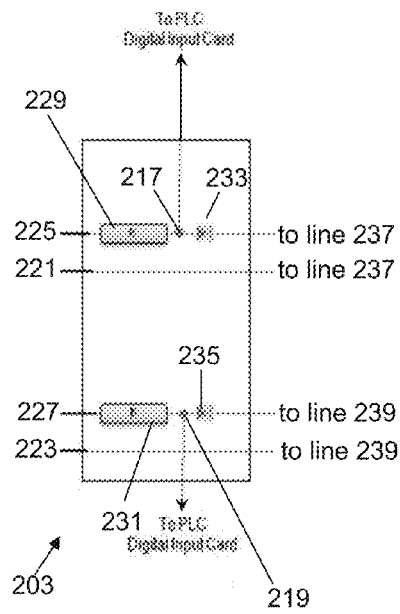
FIGS. 2B-2C are block diagrams of ground fault detection circuits in accordance with one or more embodiments of the invention.
Figure 2C:
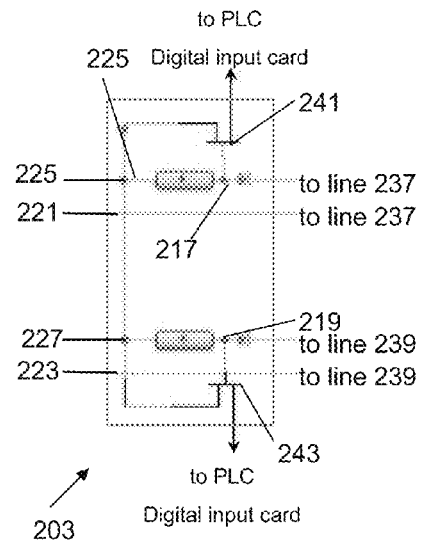

FIG. 2B is a block diagram of a ground fault detection circuit in accordance with one or more embodiments of the invention. Ground fault detection circuit 203 includes resistors 229 and 231, blocking diodes 233 and 235, and fault detection nodes 217 and 219. The values of resistors 229 and 231 are not critical to the operation of fault detection circuit 203. In accordance with one or more embodiments, resistors 229 and 231 may be within a range of 1-10 kΩ or, alternatively, within a range of 1-20 MΩ. The voltage at fault detection nodes 217 and 219 may be independently monitored with any voltage monitor known in the art. For example, FIG. 2A-2C show the nodes being monitored via a programmable logic controller ("PLC") digital input card. Preferably, the fault detection circuit 203 is deployed subsea along with the subsea electronics module. Thus, the PLC may also be deployed either subsea or topside. Furthermore, the fault detection circuit 203 may alternatively be deployed topside, in which case the PLC may also be deployed topside. Blocking diodes 233 and 235 are optional and serve to protect fault detection circuit power supply 209 and the voltage monitor.

During activation (configuration not shown) of the load 207, load power supply unit 211 is operatively connected to load 207, through relays 213 and 215. Thus, under operational configuration, load power supply unit 211 may provide power to load 207. In accordance with one or more embodiments of the invention, load power supply unit 211 may be configured as a current source that provides a constant current to solenoid valve 207.

Under fault detect configuration, as shown in FIG. 2A, fault detection circuit power supply 209 may be electrically connected through relays 213 and 215 to load 207. If a ground fault is not present anywhere in the circuit beginning at the fault detection circuit power supply 209 and terminating at the load 207, all points in the circuit will be at the fault detection circuit power supply 209 voltage, or 24V in this example. Thus, any voltage detection devices placed at nodes 217 and 219 may read a voltage equivalent to the fault detection circuit power supply 209 voltage.

Under the conditions where a ground fault has occurred in one or both of lines 237 and 239, the voltage at one of, or both, of the nodes 217 and 219 drops to a low value, nearly zero, in this example. The low voltage present at nodes 217 and 219 induced by the ground fault may be detected by any known voltage detection device and the output of the detection device may be used to, for example, inform an operator of the ground fault. Furthermore, the detection of a ground fault may trigger an automated response that initiates an appropriate safety protocol, for example, by diverting control to one or more backup valves and, in addition, by disabling any valves that may be electrically connected to the shorted control line or lines.

FIG. 2C shows a block diagram of a fault detection circuit in accordance with one or more embodiments of the invention. In FIG. 2C, FETs 241 and 243 are included to increase the reliability of the voltage detection made at the nodes 217 and 219. The FETs 241 and 243 are configured in such a way as to have their respective gate terminals connected to nodes 217 and 219, thereby isolating any voltage detection devices from the rest of the fault detection circuit through the high impedance gate-to-source path. In accordance with one or more embodiments, FETs 241 and 243 are P-channel MOS-FETs, but other types of transistors may be used, for example, N-channel MOSFETs or bipolar junction transistors. Accordingly, under normal operating conditions (i.e., no ground fault present, 24V at nodes 217 and 219), the voltage measured by a voltage detection device (e.g., a PLC digital input card) at the FET drain terminals is in a low state. In the event of a ground fault, the voltage measured at the FET drain terminals will be in a high state.

Figure 3A:
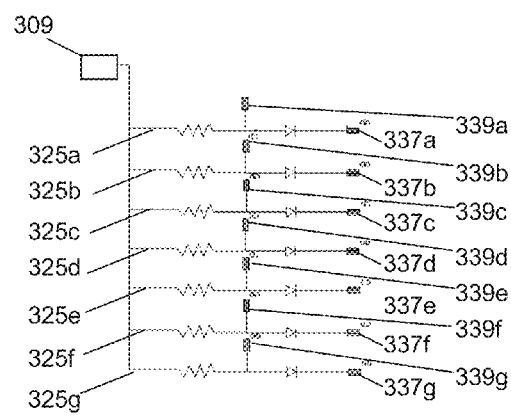
FIGS. 3A-3B are schematic diagrams of ground fault detection circuits in accordance with one or more embodiments of the invention.
Figure 3B:
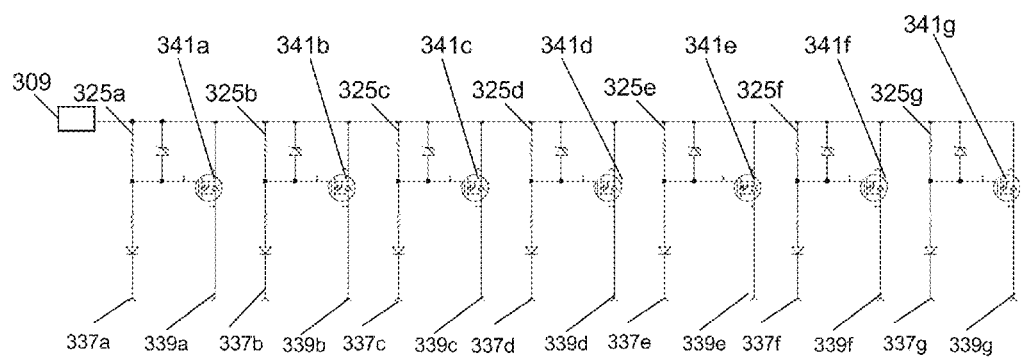

While FIGS. 2B-2C show block diagrams of ground fault detection circuits that monitor only one set of electrical subsea conductor lines, the ground fault detection system disclosed herein need not be so limited. For example, using the same operational principles outlined about, the ground fault detection system may be extended to multi-component/multi-control line systems. FIGS. 3A and 3B show examples of a multi-line fault detection circuits, corresponding to FIGS. 2B and 2C, respectively, in accordance with one or more embodiments of the invention. FIGS. 3A-3B show examples of ground fault detection circuits with seven sub-units configured in a parallel configuration. Each sub-unit of the multi-component fault detection circuits shown in FIGS. 3A-3B operates in a substantially similar way to that described above for the single component examples.

FIG. 3A shows a multiple sub-unit parallel combination ground fault detection circuit with a sub-unit design that corresponds to that shown in FIG. 2B. Specifically, fault detection circuit power supply 309 corresponds to fault detection circuit power supply 209 and provides power to ground fault detection lines 325a-325g. Likewise, outputs 337a-337g may be connected to a number of corresponding electrical subsea conductor lines via, for example, a multichannel line enable relay module (not shown). In accordance with one or more embodiments, outputs 339a-339g may be connected to the input channels of a multichannel voltage detection device, as described with reference to FIGS. 2A-2C (e.g., a PLC digital input card).

FIG. 3B shows a multiple sub-unit parallel combination ground fault detection circuit with a sub-unit design that corresponds to that shown in FIG. 2C. Specifically, fault detection circuit power supply 309 corresponds to fault detection circuit power supply 209 and provides power to ground fault detection lines 325a-325g. Likewise, outputs 337a-337g may be connected to a number of corresponding electrical subsea conductor lines via, for example, a multichannel line enable relay module (not shown). In accordance with one or more embodiments, outputs 339a-339g may be connected to the input channels of a multichannel voltage detection device, as described with reference to FIGS. 2A-2C (e.g., a PLC digital input card). P-channel MOSFETS 341a-341g may be used to increase the input impedance to the voltage detection device, as described above with reference to FIG. 2C. In addition, by incorporating two resistors into ground fault detection lines 325a-325g, as shown, the gate voltage to the P-channel MOSFET may be set appropriately. Optionally, for increased reliability, Zener diodes may be wired from gate to source to protect P-channel MOSFETS 341a-341g from high transient voltage spikes (e.g., from electrostatic discharge, or inductive kick back from a switching solenoid valve). One of ordinary skill will appreciate that many different types of transistors and resistors may be used without departing from the scope of the present disclosure. In addition, the appropriate choice of resistance values for the resistors depends on many factors, including but not limited to, the type of transistor used and value of DC voltage provided by the fault detection circuit power supply 309.

Additional circuitry may be implemented in conjunction with the circuits shown in FIGS. 3A-3B. For example, corresponding multiplexing circuitry and/or multichannel line enable relay modules may allow for the system to monitor several different sets of subsea conductor lines for driving a number of loads. One of ordinary skill will appreciate that, with the appropriate choice of power supply unit, and monitoring equipment, any number of lines may be monitored without departing from the scope of the present disclosure. Furthermore, as with FIGS. 2B-2C, blocking diodes in line with ground fault detection lines 325a-325g are optional and serve to protect the ground fault detection circuit power supply and PLC digital input card.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A ground fault detection circuit for detecting ground faults in electrical subsea conductor lines, comprising:
   a first electrical conductor line;
   a second electrical conductor line;
   a first ground fault detection line;
   a second ground fault detection line;
   a voltage source;
   a first resistor operatively connected to the voltage source and the first ground fault detection line;
   a second resistor operatively connected to the voltage source and the second ground fault detection line; and a voltage detection device configured to detect the voltage at an output end of the first resistor to determine the presence of a ground fault in at least one of the first and second conductor lines.

2. The circuit of claim 1, further comprising:
a transistor, wherein one terminal of the transistor is operatively connected to the output end of the first resistor and another terminal of the transistor is operatively connected to the first ground fault detection line to ensure a high input impedance to the voltage detection device.

3. The circuit of claim 2, further comprising a third resistor operatively connected between the first resistor and the first ground fault detection line.

4. The circuit of claim 2, further comprising a Zener diode operatively connected between a source terminal and a gate terminal of the first transistor.

5. The circuit of claim 1, further comprising a first blocking diode operatively connected between the first resistor and the first ground fault detection line.

6. The circuit of claim 1, wherein the voltage source is a regulated DC power source.

7. The circuit of claim 1, wherein the voltage detection device comprises a programmable logic controller.

8. The circuit of claim 1, wherein the resistance of the first and second resistors is within a range of 1-10 k$\Omega$.

9. The circuit of claim 1, wherein the resistance of the first and second resistors is within a range of 1-20 M$\Omega$.

10. A ground fault detection system for detecting ground faults in electrical subsea conductor lines, comprising:
a power supply unit;
a ground fault detection circuit comprising:
a first electrical conductor line;
a second electrical conductor line;
a first ground fault detection line;
a second ground fault detection line;
a first resistor operatively connected to the power supply unit and the first ground fault detection line; and
a second resistor operatively connected to the power supply unit and the second ground fault detection line;
a line enable switching module; and
a voltage detection device.

11. The ground fault detection system of claim 10, wherein the power supply unit is configured to supply power to the ground fault detection circuit and a subsea load.

12. The ground fault detection system of claim 10, wherein the voltage detection device is configured to detect the voltage at an output end of the first resistor to determine the presence of a ground fault in at least one of the first and second conductor lines.

13. The ground fault detection system of claim 10, further comprising:
a transistor, wherein one terminal of the transistor is operatively connected to the output end of the first resistor and another terminal of the transistor is operatively connected to the first ground fault detection line to ensure a high input impedance to the voltage detection device.

14. The ground fault detection system of claim 10, wherein the line enable switching module is operatively connected between the ground fault detection circuit and the electrical conductor lines and is configured to electrically isolate the ground fault detection circuit from the first and second electrical conductor lines.

15. A method for detecting ground faults in electrical subsea conductor lines using a ground fault detection system, the method comprising:
operatively connecting, in a ground fault detection circuit, a first resistor between a voltage source and a first ground fault detection line;
operatively connecting, in the ground fault detection circuit, a second resistor between the voltage source and a second ground fault detection line;
detecting a voltage at an output end of the first resistor to determine the presence of a ground fault in at least one of the first and second conductor lines; and
detecting the voltage at the output end of the first resistor through a high impendence path provided by a first transistor, wherein one terminal of the transistor is operatively connected to the output end of the first resistor and another terminal of the transistor is operatively connected to the first ground fault detection line.

* * * * *